US012156359B2

(12) United States Patent
Södergård et al.

(10) Patent No.: US 12,156,359 B2
(45) Date of Patent: Nov. 26, 2024

(54) CABLE RETENTION ARRANGEMENT AND ELECTRONIC DEVICE COMPRISING SUCH CABLE RETENTION ARRANGEMENT

(71) Applicant: Axis AB, Lund (SE)

(72) Inventors: Åke Södergård, Lund (SE); Henrik Persson, Lund (SE); Joel Nilsson, Lund (SE); Malte Bokvist, Lund (SE)

(73) Assignee: Axis AB, Lund (SE)

( * ) Notice: Subject to any disclaimer, the term of this patent is extended or adjusted under 35 U.S.C. 154(b) by 0 days.

(21) Appl. No.: 18/312,137

(22) Filed: May 4, 2023

(65) Prior Publication Data
US 2023/0397357 A1    Dec. 7, 2023

(30) Foreign Application Priority Data

Jun. 7, 2022 (EP) ..................................... 22177537

(51) Int. Cl.
 H05K 7/12 (2006.01)
 G08B 13/196 (2006.01)
(52) U.S. Cl.
 CPC ........... H05K 7/12 (2013.01); G08B 13/1963 (2013.01)
(58) Field of Classification Search
 CPC ...... H05K 5/02; H05K 5/0247; H05K 5/0204; H05K 5/0208; H05K 5/0221; H05K 7/12; H05K 7/14; G03B 17/02; G03B 17/00; H02G 3/083; H02G 3/02; H02G 3/081; H02G 3/24; H02G 3/30
(Continued)

(56) References Cited

U.S. PATENT DOCUMENTS 2,573,600 A * 10/1951 Pruehs ................. H02G 3/0633
 174/153 G
4,034,944 A * 7/1977 Moran ................. H02G 3/0625
 174/153 G
(Continued)

FOREIGN PATENT DOCUMENTS

CN   206723741 U   12/2017
CN   211830021 U   10/2020
(Continued)

OTHER PUBLICATIONS

Extended European Search Report dated Dec. 2, 2022 for European Patent Application No. 22177537.2.

*Primary Examiner* — Angel R Estrada
(74) *Attorney, Agent, or Firm* — Volpe Koenig (57) ABSTRACT

A cable retention arrangement for an electronic device, such as a surveillance camera, comprises a base member and an attachment member releasably attachable to the base member. The base member is provided with a channel configured to receive a cable and arranged in a surface of the base member configured to face the attachment member in an assembled state of the cable retention arrangement in which the attachment member is attached to the base member. The channel extends between a cable entry and a cable exit and the attachment member is provided with a slit which, in the assembled state of the cable retention arrangement, is configured to extend in a direction traversing the channel such that the cable exit of the channel is defined at the intersection of the channel and the slit. The disclosure further relates to an electronic device comprising such a cable retention arrangement.

12 Claims, 8 Drawing Sheets

(58) Field of Classification Search
USPC ............ 174/50, 559, 650, 68.1, 68.3, 152 G,
174/153 G, 40 CC, 66, 67; 361/600, 601,
361/807, 679.01; 248/68.1, 71, 49, 74.1,
248/74.2
See application file for complete search history.

(56) References Cited

U.S. PATENT DOCUMENTS

| | | | | |
|---|---|---|---|---|
| 4,487,386 | A * | 12/1984 | Hehl | H02G 3/0633 |
| | | | | 174/153 G |
| 4,809,937 | A * | 3/1989 | Emory, Jr. | H02G 3/083 |
| | | | | 248/56 |
| 5,641,941 | A | 6/1997 | Dieman, Jr. et al. | |
| 6,870,108 | B1 * | 3/2005 | Teng | H02G 15/013 |
| | | | | 174/68.3 |
| 7,388,165 | B1 * | 6/2008 | Mahoney | H02G 3/22 |
| | | | | 174/152 G |
| 7,524,201 | B2 * | 4/2009 | Ralph | H01R 13/5816 |
| | | | | 174/153 G |
| 8,609,990 | B2 * | 12/2013 | Levi | H02G 3/088 |
| | | | | 174/152 G |
| 2016/0352981 | A1 | 12/2016 | Larsson | |
| 2020/0026163 | A1 | 1/2020 | Bin et al. | |

FOREIGN PATENT DOCUMENTS

| | | |
|---|---|---|
| CN | 212543926 U | 2/2021 |
| DE | 19736006 A1 | 3/1999 |
| JP | 07-162723 A | 6/1995 |
| KR | 20120098337 A | 9/2012 |

* cited by examiner

CABLE RETENTION ARRANGEMENT AND ELECTRONIC DEVICE COMPRISING SUCH CABLE RETENTION ARRANGEMENT

FIELD OF INVENTION

The present disclosure relates to a cable retention arrangement and an electronic device comprising such a cable retention arrangement.

TECHNICAL BACKGROUND

An electronic device such as a surveillance camera is commonly provided with a cable for power and/or data transfer.

The cable may be fixedly attached to the electronic device, for instance by soldering the cable to a circuit board housed inside the electronic device. Alternatively, the cable may be provided with a connector which is attached by being pressed to a corresponding connector of the circuit board.

During handling, such as assembly, mounting or use, of the electronic device, the cable may be disconnected from the electronic device, for instance by the cable being pulled or twisted. This is especially true for an electronic device in form of a surveillance camera which may comprise several parts to be assembled, which may be installed in positions difficult to access, such as ceilings or walls, and which may be configured for rotation and/or tilt during use.

To solve this problem, it is known to clamp the cable to ensure a reliable connection. However, such clamping of the cable may expose the cable to stress which may damage the cable.

Other relevant prior art solutions may be found in US2020/0026163A1 or KR20120098337A.

SUMMARY

In view of that stated above, provided is an improved cable retention arrangement and an electronic device comprising such a cable retention arrangement. Another such a cable retention arrangement prevents unintentional disconnection of the cable from an electronic device while avoiding exposing the cable to stress during assembly, mounting and/or use.

A cable retention arrangement having the features defined in claim 1 and an electronic device having the features defined in the claims are provided according to the present disclosure. Preferred embodiments will be evident from the dependent claims.

More specifically, there is provided according to a first aspect of the present disclosure a cable retention arrangement for an electronic device, such as a surveillance camera, comprising a base member and an attachment member releasably attachable to the base member, wherein the base member is provided with a channel configured to receive a cable and arranged in a surface of the base member configured to face the attachment member in an assembled state of the cable retention arrangement in which the attachment member is attached to the base member, wherein the channel extends between a cable entry and a cable exit, and wherein the attachment member is provided with a slit which, in the assembled state of the cable retention arrangement, is configured to extend in a direction traversing the channel such that the cable exit of the channel is defined at the intersection of the channel and the slit.

Hereby, an improved cable retention arrangement is provided.

The base member, which may form part of an electronic device, is provided with the channel extending between the cable entry and the cable exit. Thus, when assembling an electronic device comprising said base member, a cable of the electronic device extending from interior of the electronic device may be arranged such that it is received by the channel.

The attachment member is releasably attachable to the base member and is provided with a slit. Thus, the cable may be inserted into the slit of the attachment member even in case a free end to the cable is provided with a connector.

When the attachment member is attached to the base member, the slit is configured to extend in a direction traversing the channel thereby defining the cable exit at the intersection. Thus, in the assembled state of the cable retention arrangement, a cable received by the channel may exit the cable retention arrangement at said cable exit.

Consequently, the cable retention arrangement may be used for securing a cable by arranging the cable such that it is received by the cannel and subsequently attaching the attachment member to the base member with the cable inserted into the slit of the attachment member. The cable enters the channel via the cable entry and exits the channel via the cable exit formed at the intersection between the cannel and the slit. The configuration of the cable retention arrangement thus makes it possible to arrange the cable with an extension comprising a first bend at the cable entry and a second bend at the cable exit. Such an arrangement makes it possible to secure the cable by means a frictional grip. The frictional grip may allow for a limited amount of movement of the cable but still sufficiently secures the cable for preventing unintentional disconnection of the cable. The securing of the cable is thus not fixed, and the limited freedom of movement for the cable reduces risk for damage to the cable during use.

According to an embodiment, the cable entry may face a recess provided in a perimeter portion of the base member, which recess is open in a lateral direction of the base member. The provision of a recess next to the cable entry facilitates arrangement of a cable in the channel. Hereby, the channel may readily receive a cable also in cases in which the free end of the cable is provided with a connector. The attachment member may further be provided with a protrusion which is configured to be received by the recess of the base member in the assembled state of the cable retention arrangement such that a cable lead-in is formed extending away from said surface of the base member. The formation of the cable lead-in extending away from the surface makes it possible to arrange a cable with an extension having a bend prior to entering the channel via the cable entry, thereby further strengthening the frictional grip securing the cable in the cable retention arrangement.

According to another embodiment, the cable entry may be arranged in a perimeter portion of the base member. The provision of the cable entry in the perimeter portion facilitates arranging the cable extension received in the channel with a bend in order to improve frictional securing of the cable.

According to yet another embodiment, the intersection defining the cable exit may be arranged in a central portion of the base member. The provision of the cable exit in a central portion of the base member facilitates cable management in case the cable retention arrangement is associated with an electronic device which is movably arranged. For instance, for an electronic device in the form of a surveillance camera provided with a rotatable, panable and tiltable optics unit, a cable exit in the central portion of the base member may minimize cable movement of the cable during operation.

According to yet another embodiment, the channel may have a straight extension and the slit may have a straight extension, and wherein the slit, in the assembled state of the cable retention arrangement, may traverse the channel at an angle equal or greater than 90°. The arrangement of the channel and the slit at an angle of at least 90° enables formation of a cable exit without sharp corners risking to damage the cable.

According to yet another embodiment, the slit may extend between a side edge of the attachment member and a slit end, which slit end is configured to coincide with the intersection defining the cable exit in the assembled state of the cable retention arrangement. Hereby, the length of the slit may be minimized thereby improving the structural integrity of the attachment member. The slit end may be provided with a radius R1. The provision of the slit end with a radius may ensure the formation of a cable exit having a shape beneficial to a cable arranged in the cable retention arrangement.

According to yet another embodiment, the channel may extend between the cable entry and a channel end, which channel end is configured to coincide the with the intersection defining the cable exit in the assembled state of the cable retention arrangement. Hereby a structure is provided giving a clear guidance of how to arrange a cable in the cable retention arrangement.

According to yet another embodiment, the channel entry may be provided with a radius R2. The provision of a radius at the cable entry facilitates arranging a cable with an extension having a bend at said cable entry, thereby improving frictional securing of the cable.

According to yet another embodiment, the attachment member may be configured for snap fit attachment to the base member.

According to yet another embodiment, the base member may be made of a metal material.

In accordance with a second aspect of the present disclosure, an electronic device is provided comprising a cable and a cable retention arrangement in accordance with the above. The cable extends from an interior of the electronic device to an exterior of the electronic device, wherein the channel of the cable retention arrangement receives the cable having an extension comprising a first bend at the cable entry and a second bend at the cable exit.

According to an embodiment, the electronic device may be a surveillance camera.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present disclosure, will be better understood through the following illustrative and non-limiting detailed description of preferred embodiments of the present disclosure, with reference to the appended drawings, where the same reference numerals will be used for similar elements, wherein.

DETAILED DESCRIPTION

The present disclosure will now be described more fully hereinafter with reference to the accompanying drawings, in which currently preferred embodiments of the disclosure are shown. This disclosure may, however, be embodied in many different forms and should not be construed as limited to the embodiments set forth herein; rather, these embodiments are provided for thoroughness and completeness, and fully convey the scope of the disclosure to the skilled person.

Figure 1:
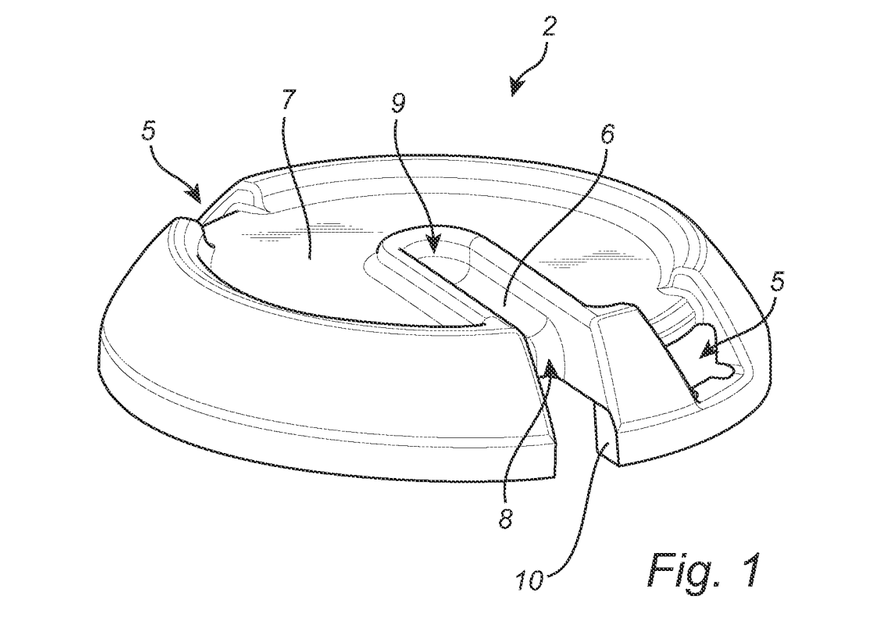
FIG. 1 is a perspective view of base member of a cable retention arrangement.
Figure 2:
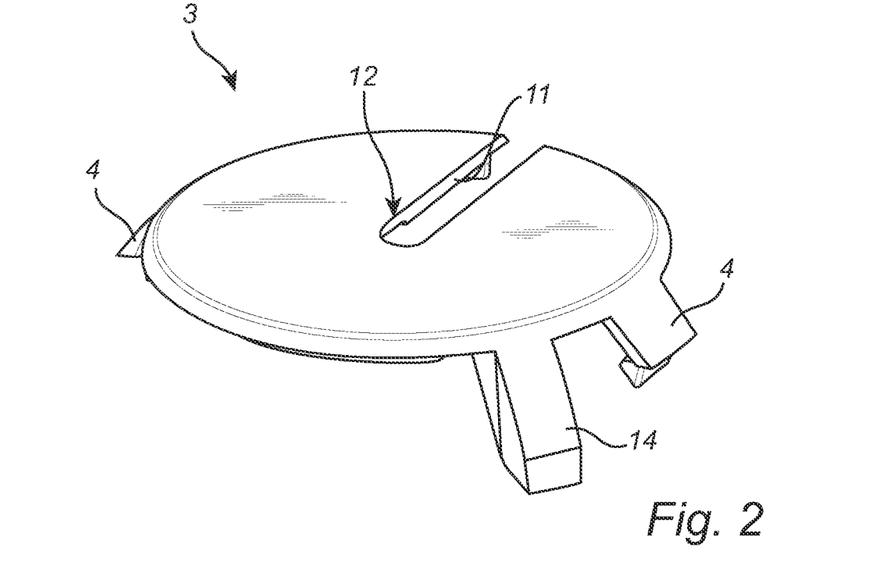
FIG. 2 is a perspective view of an attachment member of a cable retention arrangement.

FIGS. 1 and 2 illustrate a base member 2 and an attachment member 3, respectively, of a cable retention arrangement 1 for an electronic device according to an embodiment of the present disclosure. The cable retention arrangement 1 is shown in an assembled state in FIG. 3.

The attachment member 3 is releasably attachable to the base member 2, and in the shown embodiment, the attachment member 3 is provided with circumferentially arranged projections 4 configured to engage circumferentially arranged openings 5 in the base member 2 for snap fit attachment of the attachment member 3 to the base member 2.

The base member 2 may be made of a metallic or polymer material. The attachment member 3 may be made of a metallic or polymer material. The base member 2 and the attachment member 3 may be made of same type of material, or may alternatively be made of different types of materials.

The base member 2 may be made of a metallic material and configured to act as a heat sink for an electronic device to which the cable retention arrangement 1 is associated.

In the shown embodiment, the base member 2 has an essentially circular shape and is provided with a channel 6 arranged in a surface 7 configured to face the attachment member 3 in the assembled state of the cable retention arrangement 1. The channel 6 extends between a cable entry 8 and a channel end 9. In the shown embodiment, the channel 6 has a straight extension. The cable entry 8 is arranged in a perimeter portion of the base member 2 and is provided with a radius R2, which is more clearly shown in FIG. 4 which is a cross sectional view taken along line A-A in FIG. 3

The channel 6 is configured to receive a cable (not shown) and has a depth and width suitable for reception of the cable.

In the shown embodiment, the cable entry 8 of the channel 6 is facing a recess 10 provided in the perimeter portion of the base member 2. The recess 10 is open in a lateral or outward direction of the base member 2. The provision of a recess 10 being open in the lateral direction makes it possible to arrange a cable at the cable entry by insertion through the recess 10. This may facilitate handling of cables provided with a connector at the free end of the cable.

The attachment member 3 is provided with a slit 11 extending from a side edge of the attachment member 3 to a slit end 12.

The slit 11 is configured to receive a cable. The slit 11 extends from the side edge of the attachment member 3 and is thus open in an outward or lateral direction. Consequently, a cable may readily be received by the slit 11 even if the free end of the cable is provided with a connector.

In the shown embodiment, the slit 11 has a straight extension.

The slit end 12 is provided with a radius R1.

Figure 3:
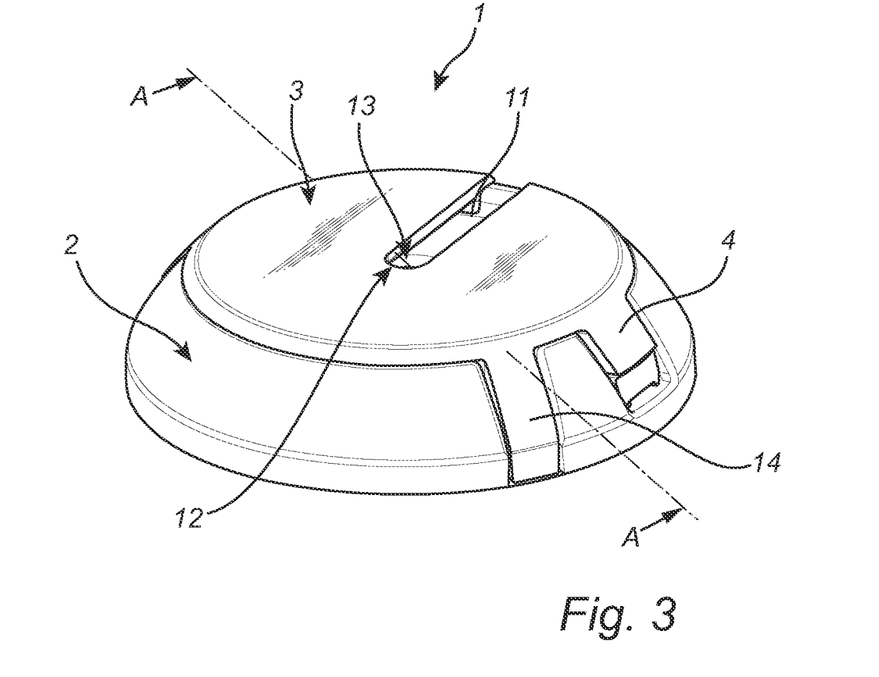
FIG. 3 is a perspective view of a cable retention arrangement in an assembled state.

The slit 11 is, in the assembled state of the cable retention arrangement 1, configured to extend in a direction traversing the channel 6. At the intersection of the channel 6 and the slit 11, a cable exit 13 is defined configured to allow exit of a cable from the channel 6.

The radius R1 of the slit end 12 ensures the formation of a cable exit 13 having a shape reducing the risk of causing damage to a cable exiting the cable retention arrangement 1 via the cable exit 13.

Figure 4:
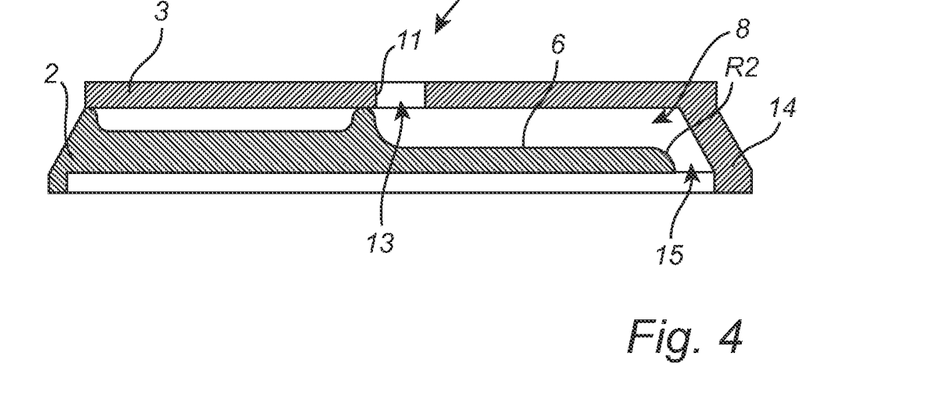
FIG. 4 is a cross-sectional view taken along line A-A in FIG. 3.

The cable exit 13 is illustrated in FIGS. 3 and 4, and in the shown embodiment, the intersection, and thus the cable exit 13, coincides with both the channel end 9 and the slit end 12. However, it is understood that this needs not be the case and that the channel 6 and/or the slit 11 may extend beyond the intersection. The cable exit 13 may be arranged at a central portion of the base member 2.

Figure 5:
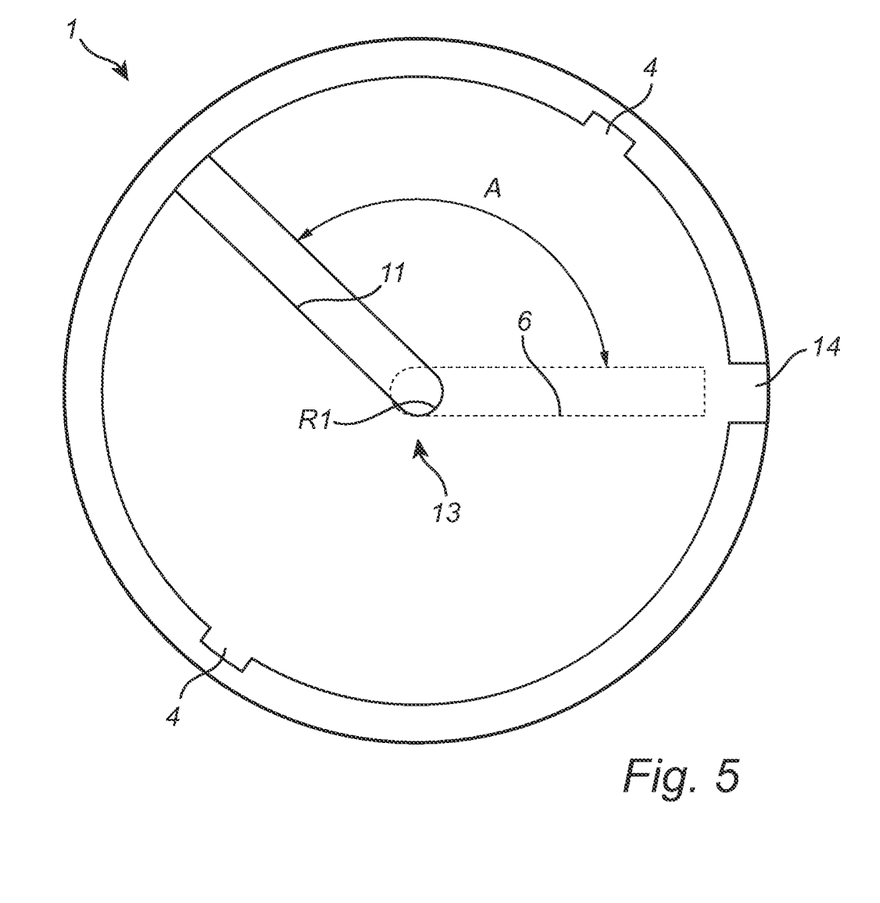
FIG. 5 is a plan view from above of a cable retention arrangement.

The slit 11 may, in the assembled state of the cable retention arrangement 1, traverse the channel 6 at an angle A equal or greater than 90°. Hereby, a more precise localization of the cable at the cable exit 13 may be achieved. The arrangement of the channel 6 and the slit 11 at an angle A of at least 90° in the assembled state of the cable retention arrangement 1 also enables formation of a cable exit 13 without sharp corners thereby reducing the risk for damage to a cable exiting the channel 6 via the cable exit. FIG. 5, to which reference now also is made, is a plan view of the cable retention arrangement 1 from above illustrating the slit 11 traversing the channel 6 at an angle A of about 120°. The channel 6 is shown by dashed lines. It is understood that an angle less than 90° results in the formation of a cable exit having a sharp corner which may cause damage to a cable exiting the channel via the cable exit.

The attachment member 3 further comprises a tab or a protrusion 14 configured to be received by the recess 10 of the base member 2 in the assembled state of the cable retention arrangement 1. The protrusion 14 is arranged at the side edge of the attachment portion 3 and extends in a downward/outward direction. When the protrusion 14 is received by the recess 10, a cable lead-in 15 is formed extending away from the surface 7 of the base member 2. The cable lead-in 15 to the cable entry 8 of the channel 6 enables a cable received by the channel 6 to have an extension with a bend prior to the cable entry 8.

In FIGS. 6A-6D, to which reference now is made, the use of the cable retention arrangement 1 described above for securing a cable 16 is illustrated.

Figure 6A:
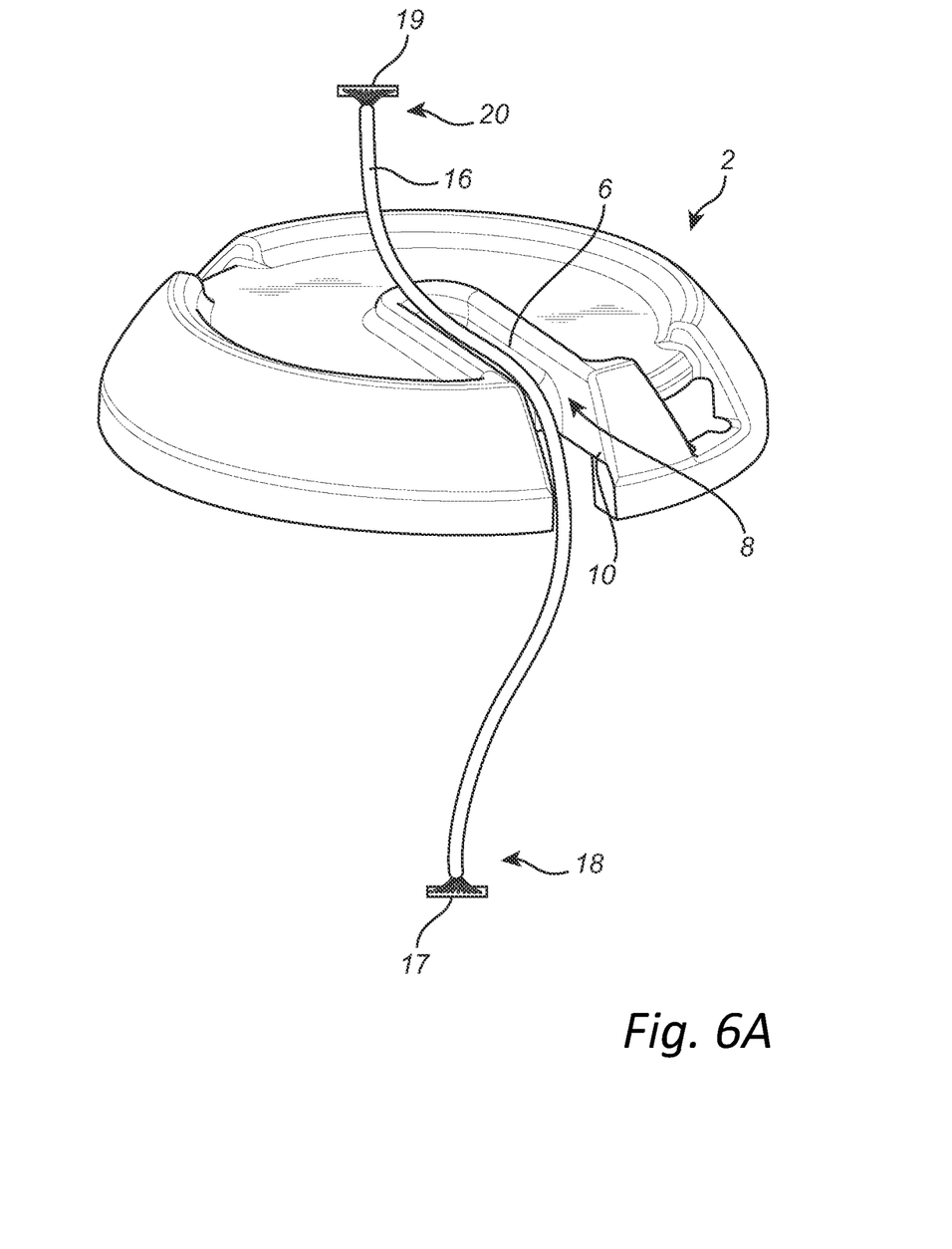
FIGS. 6A-6D are perspective views illustrating steps for assembling a cable retention arrangement.

FIG. 6A shows the base member 2 and the cable 6. The cable 16 is provided with a first connector 17 at a first free 18 end of the cable 16 and with a second connector 19 at a second free end 20 of the cable 16. The first connector 17 may be connected to an electronic device (not shown).

The cable 16 is moved such that a part of the cable 16 is arranged at the cable entry 8 of the channel 6, which movement of the cable is facilitated by the recess 10 open in the lateral direction. More specifically, the provision of a recess 10 being open in the lateral direction makes it possible to arrange the cable 16 at the cable entry by insertion through the recess 10.

Figure 6B:
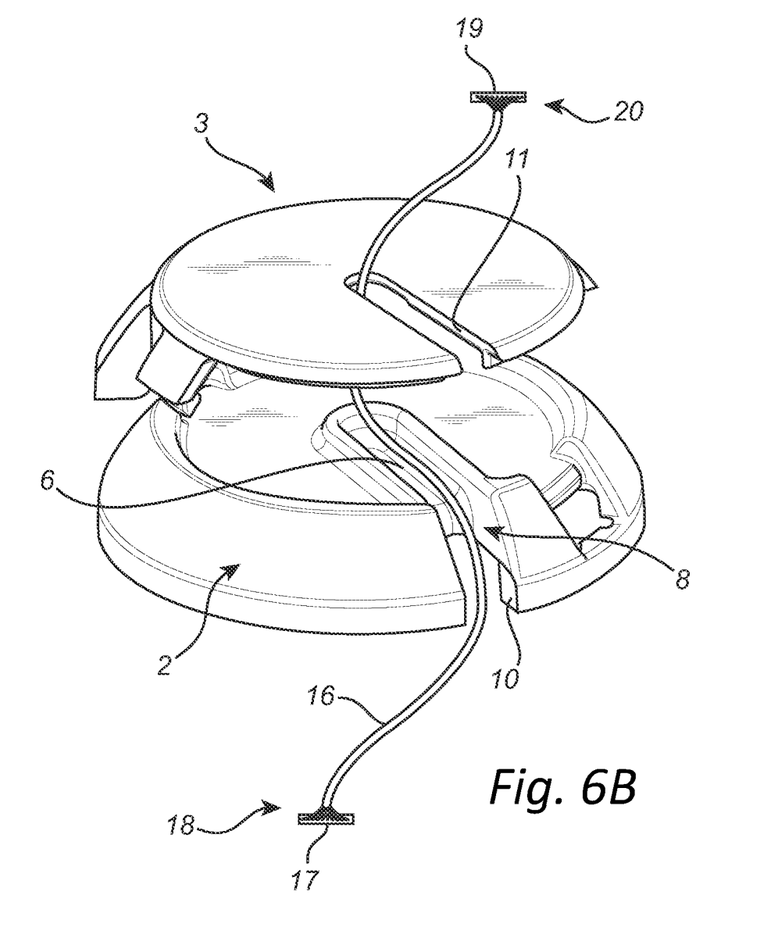

In FIG. 6B, the cable 16 has been inserted into the slit 11 of the attachment member 3. From the figure, the formation of an extension of the cable 16 with a first bend at the cable entry 8 and a second bend at the cable exit 13 may be observed.

Figure 6C:
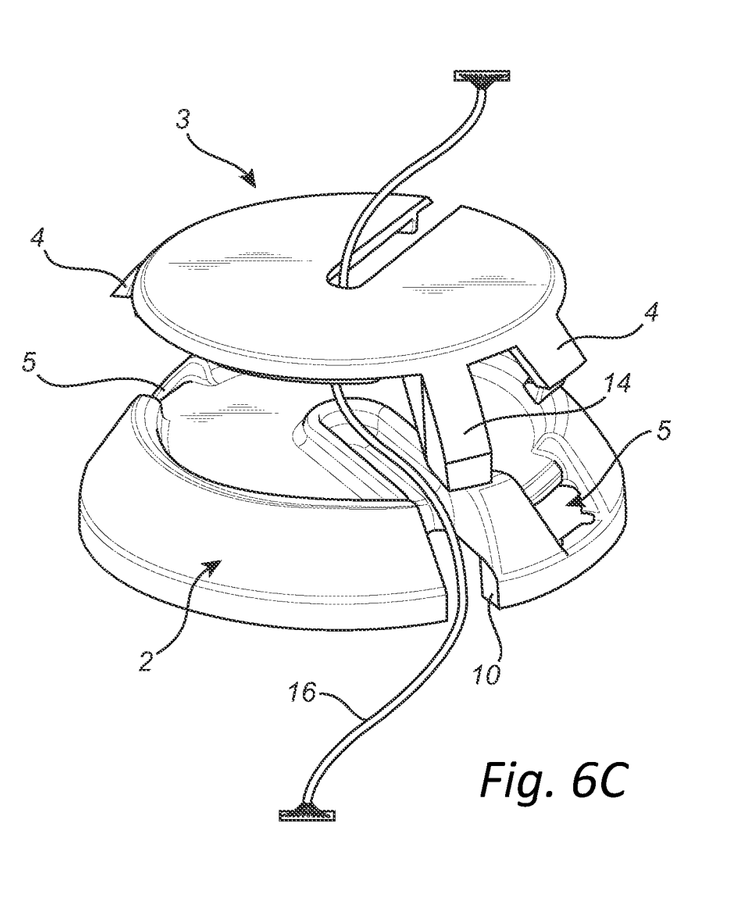

In FIG. 6C, the attachment member 3 has been rotated to align the projections 4 of the attachment member 3 with the openings 5 of the base member 2, and also to align the protrusion 14 of the attachment member 3 with the recess 10 of the base member 2.

Figure 6D:
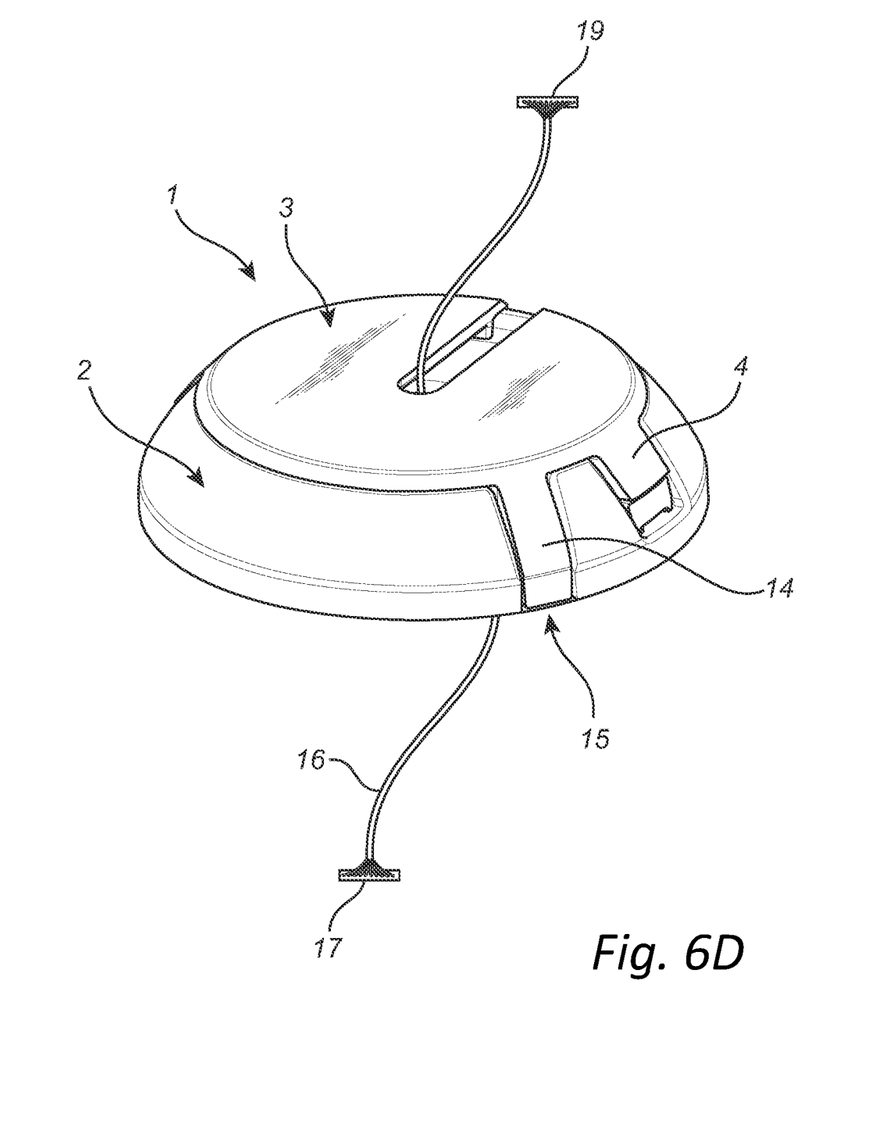

In FIG. 6D, the attachment member 3 has been releasably attached to the base member 2. More specifically, the attachment member 3 has been moved towards the base member 2 such that the projections 4 of the attachment member 3 engage the openings 5 of the base member 2 for snap fit attachment of the attachment member 3 to the base member 2 while the protrusion 14 is received by the recess 10 for formation of the cable lead-in 15. As a consequence, the cable 16 is pushed into the channel 6 of the base member 2 with an extension comprising the first bend at the cable entry 8 and the second bend at the cable exit 13. Hereby, a frictional grip is established securing the cable 16. The frictional grip may not be absolute, and a small degree of movement may be allowed for the cable 16. Such a small degree of movement may reduce the risk of damaging the cable 16 during use.

Figure 7:
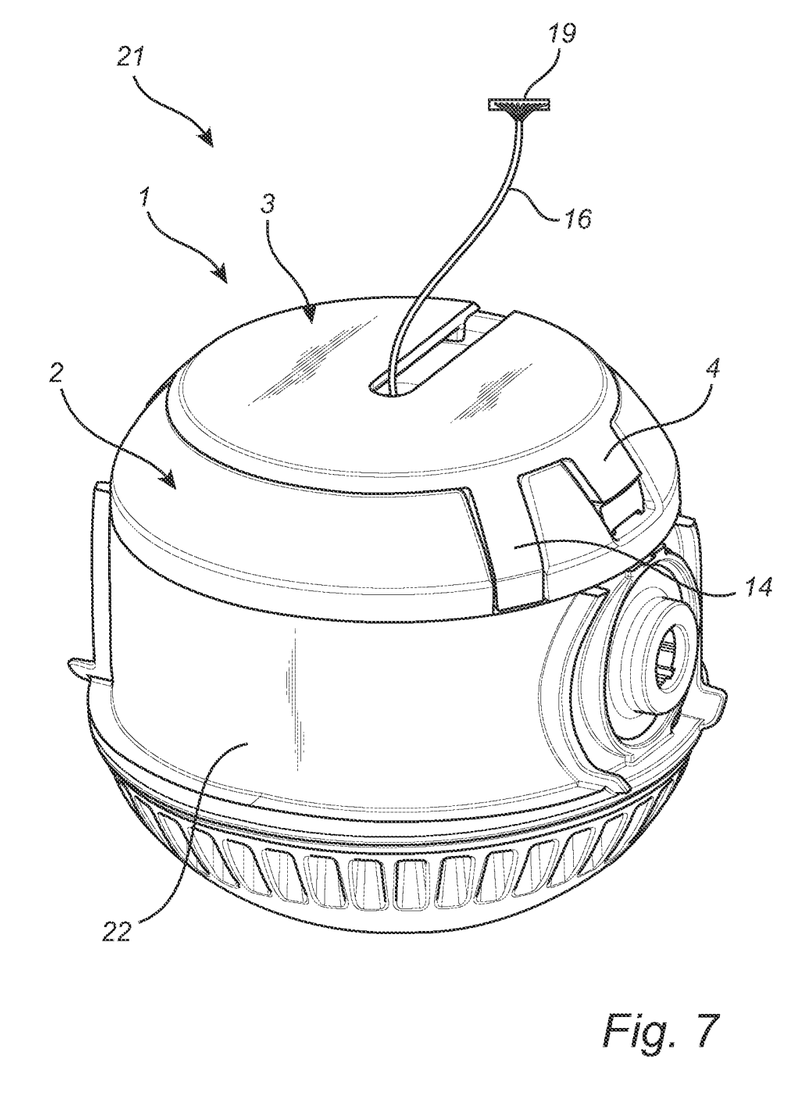
FIG. 7 is a perspective view of an electronic device comprising a cable retention arrangement.

In FIG. 7, an electronic device 21 in the form of a surveillance camera is shown. The electronic device 21 comprises a cable retention arrangement 1 of the type described above. More specifically, the base member 2 of the cable retention arrangement 1 is attached to a housing 22 of the electronic device 21. In the shown embodiment, the openings 5 in the base member 3 are used for attaching the base member 2 to the housing 22, and when the attachment member 3 is snap fit attached to the base member 2, the projections 4 of the attachment member 3 are configured to also secure the attachment of the base member 2 to the housing 22.

It will be appreciated that the present disclosure is not limited to the embodiments shown. Several modifications and variations are thus conceivable within the scope of the disclosure which thus is exclusively defined by the appended claims.

The invention claimed is:

1. A cable retention arrangement for an electronic device, such as a surveillance camera, the electronic device comprising a cable extending from an interior of the electronic device to an exterior of the electronic device, the cable retention arrangement comprising
   a base member and an attachment member releasably attachable to the base member,
   wherein the base member is provided with a channel configured to receive a cable and arranged in a surface of the base member configured to face the attachment member in an assembled state of the cable retention arrangement in which the attachment member is attached to the base member,
   wherein the channel extends between a cable entry and a cable exit, which channel is configured to receive the cable having an extension comprising a first bend at the cable entry and a second bend at the cable exit, wherein the cable entry faces a recess provided in a perimeter portion of the base member, which recess is open in a lateral direction of the base member, where the attachment member is provided with a protrusion which is configured to be received by the recess of the base member in the assembled state of the cable retention arrangement such that a cable lead-in is formed extending away from said surface of the base member, and wherein the attachment member is provided with a slit which, in the assembled state of the cable retention arrangement, is configured to extend in a direction traversing the channel such that the cable exit of the channel is defined at the intersection of the channel and the slit.

2. The cable retention arrangement according to claim 1, wherein the cable entry is arranged in a perimeter portion of the base member.

3. The cable retention arrangement according to claim 1, wherein the intersection defining the cable exit is arranged in a central portion of the base member.

4. The cable retention arrangement according to claim 1, wherein the channel has a straight extension and the slit has a straight extension, and wherein the slit, in the assembled state of the cable retention arrangement, traverses the channel at an angle A equal or greater than 90°.

5. The cable retention arrangement according to claim 1, wherein the slit extends between a side edge of the attachment member and a slit end, which slit end is configured to coincide with the intersection defining the cable exit in the assembled state of the cable retention arrangement.

6. The cable retention arrangement according to claim 5, wherein the slit end is provided with a radius R1.

7. The cable retention arrangement according to claim 1, wherein the channel extends between the cable entry and a channel end, which channel end is configured to coincide the with the intersection defining the cable exit in the assembled state of the cable retention arrangement.

8. The cable retention arrangement according to claim 1, wherein the channel entry is provided with a radius R2.

9. The cable retention arrangement according to claim 1, wherein the attachment member is configured for snap fit attachment to the base member.

10. The cable retention arrangement according to claim 1, wherein the base member is made of a metal material.

11. An electronic device comprising a cable and a cable retention arrangement, comprising
a cable extending from an interior of the electronic device to an exterior of the electronic device, the cable retention arrangement comprising
a base member and an attachment member releasably attachable to the base member,
wherein the base member is provided with a channel configured to receive a cable and arranged in a surface of the base member configured to face the attachment member in an assembled state of the cable retention arrangement in which the attachment member is attached to the base member,
wherein the channel extends between a cable entry and a cable exit, which channel is configured to receive the cable having an extension comprising a first bend at the cable entry and a second bend at the cable exit,
wherein the cable entry faces a recess provided in a perimeter portion of the base member, which recess is open in a lateral direction of the base member,
wherein the attachment member is provided with a protrusion which is configured to be received by the recess of the base member in the assembled state of the cable retention arrangement such that a cable lead-in is formed extending away from said surface of the base member, and
wherein the attachment member is provided with a slit which, in the assembled state of the cable retention arrangement, is configured to extend in a direction traversing the channel such that the cable exit of the channel is defined at the intersection of the channel and the slit, wherein the cable extends from an interior of the electronic device to an exterior of the electronic device, and the channel of the cable retention arrangement receives the cable having an extension comprising a first bend at the cable entry and a second bend at the cable exit.

12. The electronic device according to claim 11, wherein the electronic device is a surveillance camera.

* * * * *